(12) United States Patent
Han et al.

(10) Patent No.: US 8,674,516 B2
(45) Date of Patent: Mar. 18, 2014

(54) INTEGRATED CIRCUIT PACKAGING SYSTEM WITH VERTICAL INTERCONNECTS AND METHOD OF MANUFACTURE THEREOF

(75) Inventors: Byung Joon Han, Singapore (SG); In Sang Yoon, Ichon-si (KR); JoHyun Bae, Seoul (KR)

(73) Assignee: Stats Chippac Ltd., Singapore (SG)

( * ) Notice: Subject to any disclaimer, the term of this patent is extended or adjusted under 35 U.S.C. 154(b) by 160 days.

(21) Appl. No.: 13/166,802

(22) Filed: Jun. 22, 2011

(65) Prior Publication Data
US 2012/0326331 A1  Dec. 27, 2012

(51) Int. Cl.
*H01L 23/522* (2006.01)
*H01L 21/50* (2006.01)

(52) U.S. Cl.
USPC ............ 257/777; 257/E21.499; 257/E23.142; 438/107; 438/109

(58) Field of Classification Search
USPC ........... 257/777, E21.499, E23.142; 438/107, 438/109
See application file for complete search history.

(56) References Cited

U.S. PATENT DOCUMENTS

| | | | |
|---|---|---|---|
| 6,489,676 B2 | 12/2002 | Taniguchi et al. | |
| 7,049,692 B2 | 5/2006 | Nishimura et al. | |
| 7,550,836 B2 | 6/2009 | Chou et al. | |
| 7,652,367 B2 | 1/2010 | Jang et al. | |
| 7,777,351 B1 | 8/2010 | Berry et al. | |
| 7,847,413 B2 * | 12/2010 | Akiba et al. | 257/777 |
| 7,923,304 B2 * | 4/2011 | Choi et al. | 438/127 |
| 2007/0241463 A1 | 10/2007 | Yamaguchi et al. | |
| 2010/0314741 A1 | 12/2010 | Lee et al. | |

* cited by examiner

*Primary Examiner* — Long Pham
(74) *Attorney, Agent, or Firm* — Ishimaru & Associates LLP

(57) ABSTRACT

A method of manufacture of an integrated circuit packaging system includes: providing a first substrate; attaching vertical interconnects along a periphery of the first substrate; mounting an integrated circuit over the first substrate, the integrated circuit surrounded by the vertical interconnects; and mounting a second substrate directly on the vertical interconnects and the integrated circuit.

18 Claims, 6 Drawing Sheets

INTEGRATED CIRCUIT PACKAGING SYSTEM WITH VERTICAL INTERCONNECTS AND METHOD OF MANUFACTURE THEREOF

TECHNICAL FIELD

The present invention relates generally to an integrated circuit packaging system, and more particularly to a system for an integrated circuit packaging system with interconnects.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for integration and cost reduction.

Thus, a need still remains for an integrated circuit packaging system providing integration, space savings, and low cost manufacturing. In view of the ever-increasing need to increase density of integrated circuits and particularly portable electronic products, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a first substrate; attaching vertical interconnects along a periphery of the first substrate; mounting an integrated circuit over the first substrate, the integrated circuit surrounded by the vertical interconnects; and mounting a second substrate directly on the vertical interconnects and the integrated circuit.

The present invention provides an integrated circuit packaging system, including: a first substrate; vertical interconnects along a periphery of the first substrate; an integrated circuit over the first substrate, the integrated circuit surrounded by the vertical interconnects; and a second substrate directly on the vertical interconnects and the integrated circuit.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
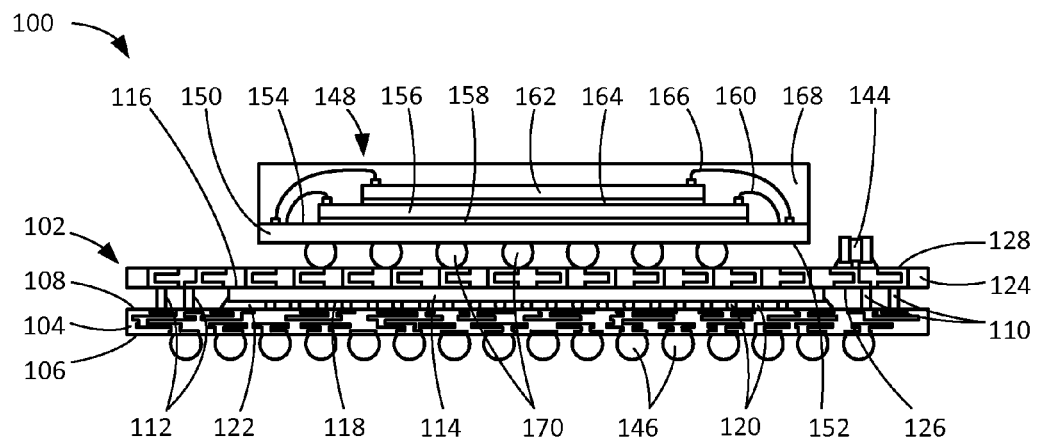
FIG. 1 is a cross-sectional view of an integrated circuit packaging system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing Figures. Similarly, although the views in the drawings for ease of description generally show similar orientations, this depiction in the Figures is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of an active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 2:
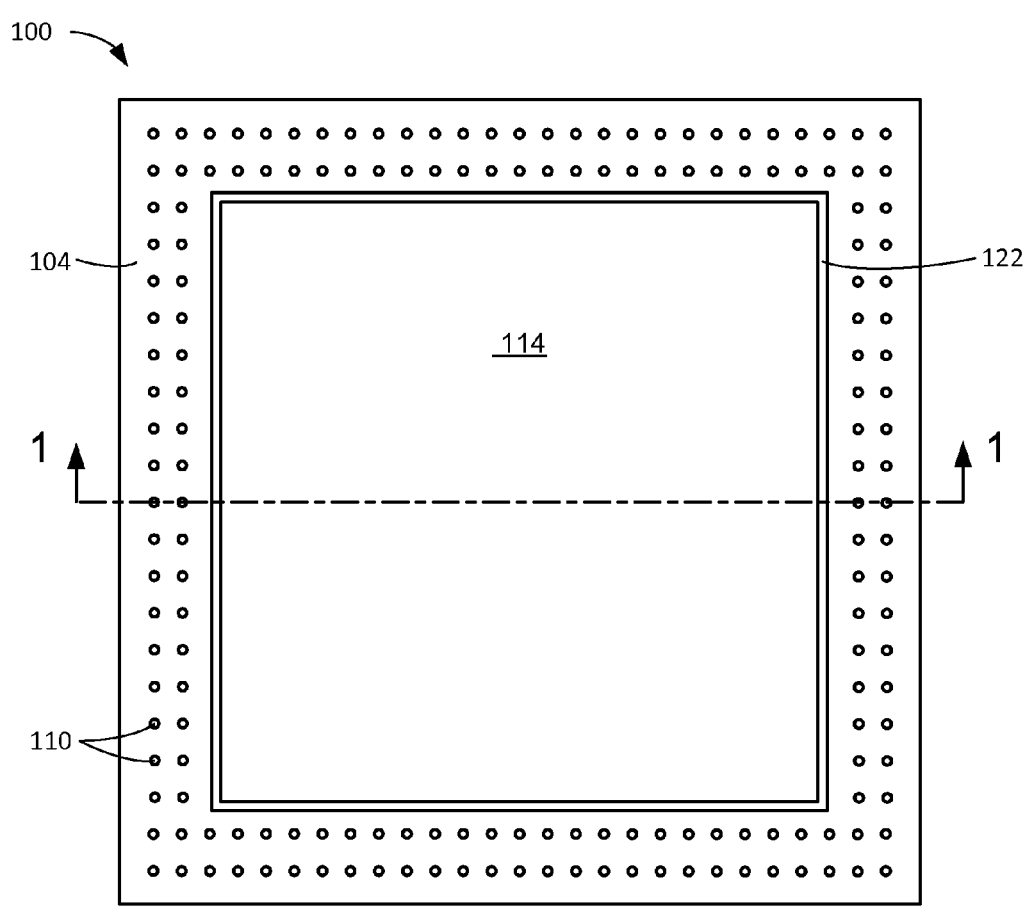
FIG. 2 is a top plan view of the integrated circuit packaging system.

Referring now to FIG. 1, therein is shown a cross-sectional view of an integrated circuit packaging system 100 taken along line 1-1 of FIG. 2 in a first embodiment of the present invention. The integrated circuit packaging system 100 can include an enhanced fan-in package-on-package base (Fi-PoPb) package using copper (Cu) pillar or a fan-in package-on-package base package without mold.

The integrated circuit packaging system 100 can include a base package 102, which is defined as a semiconductor package. The base package 102 can include a first substrate 104 having a first substrate bottom side 106 and a first substrate top side 108 opposite the first substrate bottom side 106. The first substrate 104 is defined as a support structure for mounting and connecting an integrated circuit thereto including providing electrical connections through the support structure.

The base package 102 can include vertical interconnects 110 having non-horizontal sides 112. The vertical interconnects 110 can be attach directly on the first substrate top side 108. Each of the vertical interconnects 110 can preferably be formed of a common material characteristic of being formed as a single integral structure.

The vertical interconnects 110 are defined as electrically conductive structures for mounting and connection purposes. The non-horizontal sides 112 are defined as sides that form a lateral boundary of the vertical interconnects 110.

For example, the non-horizontal sides 112 can be perpendicularly attached to the first substrate top side 108. Also for example, the non-horizontal sides 112 can be parallel to each other.

As an example, the non-horizontal sides 112 can include planar or curve surfaces. As another example, the vertical interconnects 110 can include vertical heights approximately equal to each other. As a specific example, the vertical interconnects 110 can include vertical heights equal to each other.

The base package 102 can include an integrated circuit 114 having an integrated circuit inactive side 116 and an integrated circuit active side 118 opposite the integrated circuit inactive side 116. The integrated circuit 114 is defined as a semiconductor device having a number of integrated transistors interconnected to form active circuits. The integrated circuit 114 can be mounted over the first substrate 104 with the integrated circuit active side 118 facing the first substrate top side 108.

The base package 102 can include connectors 120 attached to the integrated circuit active side 118 and the first substrate top side 108. The connectors 120 are defined as electrically conductive connectors for connecting an integrated circuit to another system level.

The base package 102 can include an underfill 122 filled between the integrated circuit active side 118 and the first substrate top side 108. The underfill 122 can be applied directly on the connectors 120 to protect the connectors 120.

Each of the vertical interconnects 110 can include a vertical height approximately equal to a combination of a vertical height of the integrated circuit 114 and a vertical height of each of the connectors 120. For a specific example, each of the vertical interconnects 110 can include a vertical height equal to a combination of a vertical height of the integrated circuit 114 and a vertical height of each of the connectors 120. A plane of a top extent of each of the vertical interconnects 110 can be coplanar with a plane of the integrated circuit inactive side 116.

The vertical interconnects 110 can provide reduced or fine pitch. Wire bonding (W/B) interconnection is not needed in fan-in package-on-package base packages. Manufacturing cost can be reduced using the vertical interconnects 110 because the vertical interconnects 110 can be formed without several processes including z-interconnection and underfill.

A vertical height of each of the vertical interconnects 110 is defined as a vertical distance extending between bottom and top extents of each of the vertical interconnects 110. A vertical height of the integrated circuit 114 is defined as a vertical distance extending between the integrated circuit inactive side 116 and the integrated circuit active side 118.

A vertical height of each of the connectors 120 is defined as a vertical distance extending between bottom and top extents of each of the connectors 120. A vertical height of each of the connectors 120 can represent a vertical distance extending between the integrated circuit active side 118 and the first substrate top side 108.

The base package 102 can include a second substrate 124 having a second substrate bottom side 126 and a second substrate top side 128 opposite the second substrate bottom side 126. Vertical thickness of the vertical interconnects 110 can be adjusted or controlled to provide a height for stacking up the second substrate 124 over the integrated circuit 114.

Warpage can be controlled using dual side substrate with the first substrate 104 and the second substrate 124. Warpage can also be controlled with the vertical interconnects 110 attached directly to the first substrate 104 and the second substrate 124.

The second substrate 124 can be mounted over the vertical interconnects 110 and the integrated circuit 114. The second substrate bottom side 126 can be mounted directly on the vertical interconnects 110 and the integrated circuit inactive side 116. The second substrate 124 is defined as a support structure for mounting and connecting an integrated circuit thereto including providing electrical connections through the support structure.

The second substrate 124 can include a horizontal length approximately equal to a horizontal length of the first substrate 104. For a specific example, the second substrate 124 can include a horizontal length equal to a horizontal length of the first substrate 104. Horizontal lengths of the second substrate 124 and the first substrate 104 are defined as horizontal distances between non-horizontal sides of the second substrate 124 and the first substrate 104, respectively.

The vertical interconnects 110 can be joined or attached to the first substrate 104 and the second substrate 124. For example, the vertical interconnects 110 can be attached to the first substrate 104, the second substrate 124, or a combination thereof with solder on pad (SOP), solder cap on each of the vertical interconnects 110, or conductive paste.

The base package 102 can include a component 144 mounted over the second substrate top side 128. The component 144 is defined as a semiconductor device. For example, the component 144 can represent a semiconductor device including a passive component. For a specific example, the component 144 can represent a capacitor or a resistor.

The base package 102 can include base interconnects 146 attached to the first substrate bottom side 106 to provide electrical connection between the first substrate 104 and an external system (not shown). The base interconnects 146 are defined as electrically conductive connectors.

The integrated circuit packaging system 100 can include a stack package 148, which is defined as a semiconductor package, mounted over the base package 102. For example, the stack package 148 can represent a semiconductor package including a multi-chip-package (MCP) or a memory.

The stack package 148 can include a stack substrate 150 having a stack substrate bottom side 152 and a stack substrate top side 154 opposite the stack substrate bottom side 152.

The stack substrate 150 is defined as a support structure for mounting and connecting an integrated circuit thereto including providing electrical connections through the support structure. For example, the stack substrate 150 can represent a support structure including a multi-layer support structure including a printed circuit board (PCB), a laminated substrate, or a ceramic substrate.

The stack package 148 can include a horizontal length greater than half of a horizontal length of the base package 102. The stack package 148 can include a horizontal length less than a horizontal length of the base package 102.

The stack package 148 can include a first device 156 attached to the stack substrate 150 with a first attach layer 158. The first device 156 can be electrically connected to the stack substrate top side 154 with first device connectors 160.

The stack package 148 can include a second device 162 attached to the first device 156 with a second attach layer 164.

The second device 162 can be electrically connected to the stack substrate top side 154 with second device connectors 166.

The stack package 148 can include a stack encapsulation 168 over the stack substrate 150, the first device 156, the first attach layer 158, the first device connectors 160, the second device 162, the second attach layer 164, and the second device connectors 166. The stack package 148 can include stack connectors 170 attached to the stack substrate bottom side 152 and the second substrate top side 128 to provide electrical connection between the stack substrate 150 and the second substrate 124.

The stack connectors 170 are defined as electrically conductive connectors. The stack connectors 170 can represent electrical connectors including conductive balls, conductive columns, or conductive studs. The stack connectors 170 can be formed with a conductive material including a metallic material or a metal alloy. For example, the stack connectors 170 can represent electrical connectors including solder balls.

The integrated circuit packaging system 100 can include package integration of multiple functions including modem, radio frequency (RF), memory, graphic, and internet. The integrated circuit packaging system 100 can include stack packages, each of which having limited function, in one package. The integrated circuit packaging system 100 can include a method that provides package size reduction and cost innovation using copper (Cu) pillars.

The integrated circuit packaging system 100 can be applicable to a packaging system with a number of input/output (I/O) or various packages by customer market demand. The integrated circuit packaging system 100 can include off-the-shelf packages and can utilize the remained area as system-in-a-package (SiP) with components including capacitor and power module attached. Package cost can be reduced because of reduced number of processes including pre-cleaning, solder ball attachment, de-flux and material including solder ball and flux.

It has been discovered that the second substrate 124 directly on the vertical interconnects 110 and the integrated circuit inactive side 116 provides a significant reduction of package thickness and size thereby solving problems of large fan-in package-on-package base (FiPoPb) package, total thickness of stacked packages, and manufacturing cost.

It has also been discovered that each of the vertical interconnects 110 having a vertical height approximately equal to a combination of a vertical height of the integrated circuit 114 and a vertical height of each of the connectors 120 provides reduced package height profile.

It has been unexpectedly found that each of the vertical interconnects 110 formed with a single integral structure provides structural integrity.

It has been unexpectedly determined that the vertical interconnects 110 provide pitch and size reduction compared to other package-on-package packages, which are limited in reducing package size and thickness because of large interconnection pitch or size such as using solder balls for interconnection with wider substrate area due to large solder ball diameter and equipment capacity of solder ball mounter.

It has been unexpectedly recognized that the vertical interconnects 110 attached to the second substrate 124 and the first substrate 104 eliminates warpage resulting in improved reliability.

Referring now to FIG. 2, therein is shown a top plan view of the integrated circuit packaging system 100. The top plan view depicts the integrated circuit packaging system 100 without the second substrate 124 of FIG. 1, the component 144 of FIG. 1, and the stack package 148 of FIG. 1.

The underfill 122 can be formed directly on the first substrate 104. The underfill 122 can be formed having a perimeter extending beyond or greater than a perimeter of the integrated circuit 114.

The integrated circuit 114 can be surrounded by a peripheral array of the vertical interconnects 110. The peripheral array is defined as multiple rows of the vertical interconnects 110 formed adjacent a perimeter of the first substrate 104. The vertical interconnects 110 can be formed or attached along a periphery of the first substrate 104.

For illustration purposes, the vertical interconnects 110 are shown with circular shapes, although it is understood that the vertical interconnects 110 can include any other shapes. For example, the vertical interconnects 110 can include rectangular shapes.

It has been discovered that the vertical interconnects 110 provides improved reliability with the vertical interconnects 110 uniformly or evenly distributed to spread forces that eliminate warpage.

Figure 3:
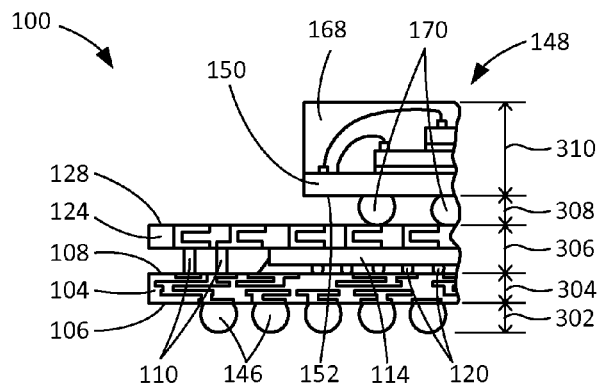
FIG. 3 is a detailed view of a portion of the integrated circuit packaging system.

Referring now to FIG. 3, therein is shown a detailed view of a portion of the integrated circuit packaging system 100. The integrated circuit packaging system 100 can include a first height 302, a second height 304, a third height 306, a fourth height 308, and a fifth height 310 representing a total height of the integrated circuit packaging system 100.

The first height 302 is defined as a vertical distance extending between bottom and top extents of each of the base interconnects 146. For example, the first height 302 can represent a bottom solder ball height, depicted as a vertical height of each of the base interconnects 146.

The second height 304 is defined as a vertical distance extending between the first substrate bottom side 106 and the first substrate top side 108. For example, the second height 304 can represent a bottom substrate thickness, depicted as a vertical height of the first substrate 104.

The third height 306 is defined as a vertical distance extending between the first substrate top side 108 and the second substrate top side 128. The third height 306 can represent a combination of vertical distances of each of the vertical interconnects 110 and the second substrate 124. The third height 306 can also represent a combination of vertical distances of the integrated circuit 114, each of the connectors 120, and the second substrate 124. For example, the third height 306 can include a bottom mold cap thickness, such as a vertical distance extending between bottom and top extents of an optional encapsulation.

The fourth height 308 is defined as a vertical distance extending between bottom and top extents of each of the stack connectors 170. For example, the fourth height 308 can represent a ball height for top package (PKG) mounting, depicted as a vertical height of each of the stack connectors 170.

The fifth height 310 is defined as a vertical distance extending between the stack substrate bottom side 152 and a top extent of the stack encapsulation 168. For example, the fifth height 310 can represent a thickness of a top package including a substrate and a mold cap, depicted as a combination of vertical heights of the stack substrate 150 and the stack encapsulation 168.

For example, the integrated circuit packaging system 100 can include a package dimension of 11 millimeters (mm) by 11 millimeters (mm) or 121 square millimeters (mm2), which is a reduction from a package dimension of 14 millimeters by 14 millimeters or 196 square millimeters for a molded laser package (MLP) or a package dimension of 12 millimeters by 12 millimeters or 144 square millimeters for other fan-in package-on-package (FiPoP) packages.

As a specific example, each of the base interconnects 146 can include the first height 302 of approximately 0.18 millimeters. As a specific example, each of the base interconnects 146 can include a ball diameter of approximately 0.25 millimeters and a ball pitch of approximately 0.40 millimeters.

A substrate thickness of a molded laser package can be greater than the second height 304 due to warpage control. As a specific example, the first substrate 104 can include the second height 304 of approximately 0.24 millimeters, which is a reduced height compared to a substrate thickness of approximately 0.30 millimeters in a molded laser package or a package-on-package.

As a specific example, the third height 306 can be approximately 0.28 millimeters compared to 0.33 millimeters of a corresponding height of other fan-in package-on-package packages.

A gap between a top of a fan-in package-on-package base package, depicted as the second substrate top side 128, and a bottom of a fan-in package-on-package top package can be less than that of another packaging system. As a specific example, each of the stack connectors 170 can include the fourth height 308 of approximately 0.06 millimeters with an approximately 0.20 millimeter ball size compared to a ball height of approximately 0.34 millimeters with an approximately 0.325 millimeter ball size for a molded laser package.

As another specific example, each of the stack connectors 170 can include the fourth height 308 of approximately 0.06 millimeters with an approximately 0.20 millimeter ball size compared to a ball height of approximately 0.12 millimeters with an approximately 0.25 millimeter ball size of other fan-in package-on-package packages. As a further specific example, the fifth height 310 can be approximately 0.48 millimeters with the second substrate 124 having a thickness of approximately 0.13 millimeters.

The integrated circuit packaging system 100 can be thinner than an equivalent molded laser package. As a specific example, the total height of the integrated circuit packaging system 100 can be approximately be 1.24 millimeters compared to a total height of approximately 1.30 millimeters for a molded laser package or a total height of approximately 1.35 millimeters for other fan-in package-on-package packages. As another specific example, the integrated circuit packaging system 100 can include an off-the-shelf package for a top package, depicted as the stack package 148.

Figure 4:
FIG. 4 is a cross-sectional view of the integrated circuit packaging system in a substrate-providing phase of manufacture.

Referring now to FIG. 4, therein is shown a cross-sectional view of the integrated circuit packaging system 100 in a substrate-providing phase of manufacture. The integrated circuit packaging system 100 can include the base package 102.

The first substrate 104 can be provided for the base package 102. For example, the first substrate 104 can represent a support structure including a multi-layer support structure. For a specific example, the first substrate 104 can represent a support structure including a printed circuit board (PCB), a laminated substrate, or a ceramic substrate. For another specific example, the first substrate 104 can represent a base substrate.

The base package 102 can include the vertical interconnects 110 mounted directly on the first substrate top side 108. The vertical interconnects 110 can be mounted adjacent a periphery of the first substrate 104.

For example, the vertical interconnects 110 can represent electrical connectors including a conductive pillar, a conductive post, or a conductive column. Also for example, the vertical interconnects 110 can be formed with an electrically conductive material including a metallic material or a metal alloy. Further for example, the vertical interconnects 110 and the first substrate 104 can be provided or supplied together. For a specific example, the vertical interconnects 110 can represent copper (Cu) pillars.

A vertical height of each of the vertical interconnects 110 can be controlled such that the second substrate bottom side 126 of FIG. 1 can be mounted directly on the vertical interconnects 110 and the integrated circuit inactive side 116 of FIG. 1 in a subsequent phase. The vertical height of each of the vertical interconnects 110 can be controlled with an application of a mask layer (not shown). The mask layer is defined as a structure resistant to a removal process. For example, the mask layer can represent a structure including a dry film resist (DFR) or a resist mask.

The mask layer can be deposited or applied directly on the first substrate top side 108. The mask layer can be patterned such that the mask layer can include a pattern of openings exposing portions of the first substrate top side 108. A plating process can be performed to fill an electrically conductive material within the openings forming the vertical interconnects 110 directly on the first substrate top side 108. The electrically conductive material can be filled up to a top surface of the mask layer. The mask layer can be removed leaving portions of the first substrate top side 108 exposed.

The vertical height of each of the vertical interconnects 110 can be approximately equal to a vertical thickness of the mask layer, which is defined as a vertical distance extending from a bottom surface of the mask layer to the top surface of the mask layer. For a specific example, the vertical height of each of the vertical interconnects 110 can be equal to the vertical thickness of the mask layer. For another specific example, planes of top extents of the vertical interconnects 110 and a plane of a top surface of the mask layer can be coplanar with each other.

Figure 5:
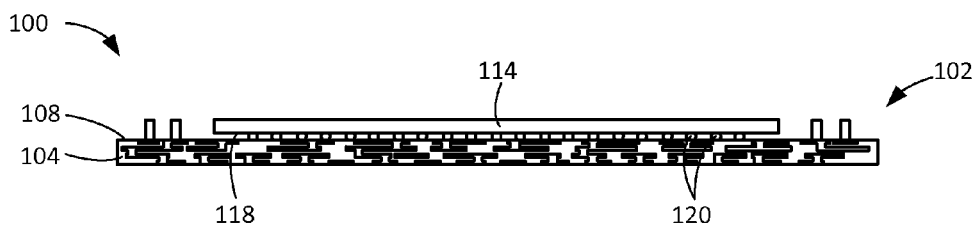
FIG. 5 is the structure of FIG. 4 in a first mounting phase.

Referring now to FIG. 5, therein is shown the structure of FIG. 4 in a first mounting phase. The base package 102 can include the integrated circuit 114 mounted over the first substrate 104. The integrated circuit active side 118 can be attached to the first substrate top side 108 with the connectors 120. For example, the integrated circuit 114 can represent a semiconductor device including a flip chip, an integrated circuit die, or a wirebond integrated circuit.

For example, the connectors 120 can represent electrical connectors including conductive bumps, conductive balls, or conductive studs. Also for example, the connectors 120 can be formed with an electrically conductive material including a metallic material or a metal alloy. For a specific example, the connectors 120 can represent electrical connectors including solder bumps.

Figure 6:
FIG. 6 is the structure of FIG. 5 in an applying phase.

Referring now to FIG. 6, therein is shown the structure of FIG. 5 in an applying phase. The base package 102 can include the underfill 122 applied between the integrated circuit active side 118 and the first substrate top side 108. The underfill 122 can cover the connectors 120.

Figure 7:
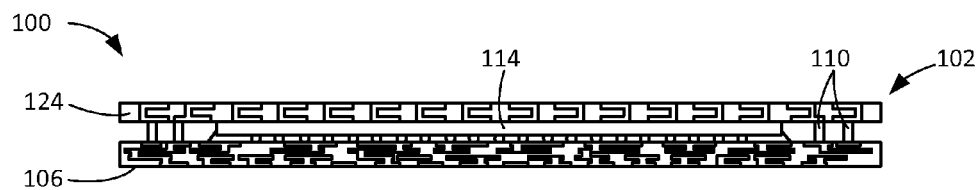
FIG. 7 is the structure of FIG. 6 in a second mounting phase.

Referring now to FIG. 7, therein is shown the structure of FIG. 6 in a second mounting phase. The base package 102 can include the second substrate 124 mounted over the vertical interconnects 110 and the integrated circuit 114. For a specific example, the second substrate 124 mounted or attached directly on the vertical interconnects 110 and the integrated circuit 114.

For example, the second substrate 124 can represent a support structure including a multi-layer support structure. For a specific example, the second substrate 124 can represent a support structure including an interposer, a printed circuit board (PCB), a laminated substrate, or a ceramic substrate.

In a subsequent phase, the base interconnects 146 of FIG. 1 can be attached to the first substrate bottom side 106. The base interconnects 146 can represent electrical connectors including conductive balls, conductive columns, or conductive studs. The base interconnects 146 can be formed with a conductive material including a metallic material or a metal alloy. For example, the base interconnects 146 can represent electrical connectors including solder balls.

Figure 8:
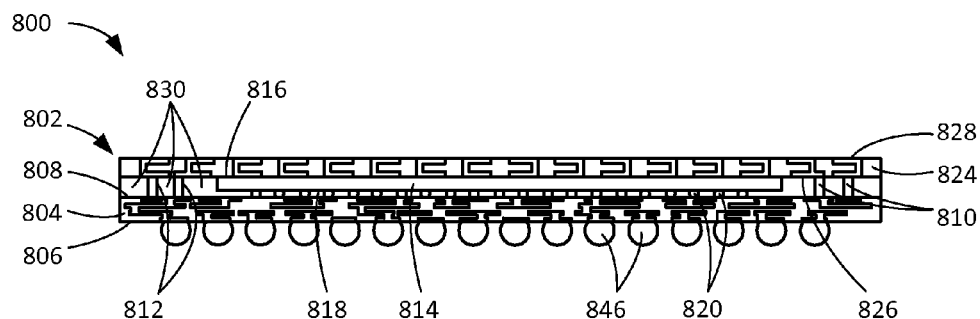
FIG. 8 is a cross-sectional view of an integrated circuit packaging system in a second embodiment of the present invention.

Referring now to FIG. 8, therein is shown a cross-sectional view of an integrated circuit packaging system 800 in a second embodiment of the present invention. The integrated circuit packaging system 800 can include an enhanced fan-in package-on-package base (FiPoPb) package using copper (Cu) pillar or an NG fan-in package-on-package base package with molded underfill.

The integrated circuit packaging system 800 can include a base package 802, which is defined as a semiconductor package. The base package 802 can include a first substrate 804 having a first substrate bottom side 806 and a first substrate top side 808 opposite the first substrate bottom side 806. The first substrate 804 is defined as a support structure for mounting and connecting an integrated circuit thereto including providing electrical connections through the support structure.

The base package 802 can include vertical interconnects 810 having non-horizontal sides 812. The vertical interconnects 810 can be attach directly on the first substrate top side 808. The vertical interconnects 810 are defined as electrically conductive structures for mounting and connection purposes. The non-horizontal sides 812 are defined as sides that form a lateral boundary of the vertical interconnects 810.

For example, the non-horizontal sides 812 can be perpendicularly attached to the first substrate top side 808. Also for example, the non-horizontal sides 812 can be parallel to each other.

As an example, the non-horizontal sides 812 can include planar or curve surfaces. As another example, the vertical interconnects 810 can include vertical heights approximately equal to each other.

The base package 802 can include an integrated circuit 814 having an integrated circuit inactive side 816 and an integrated circuit active side 818 opposite the integrated circuit inactive side 816. The integrated circuit 814 is defined as a semiconductor device having a number of integrated transistors interconnected to form active circuits. The integrated circuit 814 can be mounted over the first substrate 804 with the integrated circuit active side 818 facing the first substrate top side 808.

The base package 802 can include connectors 820 attached to the integrated circuit active side 818 and the first substrate top side 808. The connectors 820 are defined as electrically conductive connectors for connecting an integrated circuit to another system level.

Each of the vertical interconnects 810 can include a vertical height approximately equal to a combination of a vertical height of the integrated circuit 814 and a vertical height of each of the connectors 820. For a specific example, each of the vertical interconnects 810 can include a vertical height equal to a combination of a vertical height of the integrated circuit 814 and a vertical height of each of the connectors 820.

A vertical height of each of the vertical interconnects 810 is defined as a vertical distance extending between bottom and top extents of each of the vertical interconnects 810. A vertical height of the integrated circuit 814 is defined as a vertical distance extending between the integrated circuit inactive side 816 and the integrated circuit active side 818.

A vertical height of each of the connectors 820 is defined as a vertical distance extending between bottom and top extents of each of the connectors 820. A vertical height of each of the connectors 820 can represent a vertical distance extending between the integrated circuit active side 818 and the first substrate top side 808.

The base package 802 can include a second substrate 824 having a second substrate bottom side 826 and a second substrate top side 828 opposite the second substrate bottom side 826. The second substrate 824 can be mounted over the vertical interconnects 810 and the integrated circuit 814. The second substrate bottom side 826 can be directly on the vertical interconnects 810 and the integrated circuit inactive side 816. The second substrate 824 is defined as a support structure for mounting and connecting an integrated circuit thereto including providing electrical connections through the support structure.

The second substrate 824 can include a horizontal length approximately equal to a horizontal length of the first substrate 804. For a specific example, the second substrate 824 can include a horizontal length equal to a horizontal length of the first substrate 804. Horizontal lengths of the second substrate 824 and the first substrate 804 are defined as horizontal distances between non-horizontal sides of the second substrate 824 and the first substrate 804, respectively.

The vertical interconnects 810 can be joined or attached to the first substrate 804 and the second substrate 824. For example, the vertical interconnects 810 can be attached to the first substrate 804, the second substrate 824, or a combination thereof with solder on pad (SOP), solder cap on each of the vertical interconnects 810, or conductive paste.

The base package 802 can include an encapsulation 830, which is defined as a package cover of a semiconductor package to seal an integrated circuit providing mechanical and environmental protection. The encapsulation 830 can be formed between the first substrate 804 and the second substrate 824. The encapsulation 830 can partially cover the vertical interconnects 810, the integrated circuit 814, and the connectors 820.

The base package 802 can include base interconnects 846 attached to the first substrate bottom side 806 to provide electrical connection between the first substrate 804 and an external system (not shown). The base interconnects 846 are defined as electrically conductive connectors.

It has been discovered that the second substrate 824 directly on the vertical interconnects 810 and the integrated circuit inactive side 816 provides a significant reduction of package thickness and size thereby solving problems of large fan-in package-on-package base (FiPoPb) package, total thickness of stacked packages, and manufacturing cost.

It has also been discovered that each of the vertical interconnects 810 having a vertical height approximately equal to a combination of a vertical height of the integrated circuit 814 and a vertical height of each of the connectors 820 provides reduced package height profile.

It has been unexpectedly found that each of the vertical interconnects 810 formed with a single integral structure provides structural integrity.

It has been unexpectedly determined that the vertical interconnects 810 provide pitch and size reduction compared to other package-on-package packages, which are limited in reducing package size and thickness because of large interconnection pitch or size such as using solder balls for interconnection with wider substrate area due to large solder ball diameter and equipment capacity of solder ball mounter.

It has been unexpectedly recognized that the vertical interconnects 810 attached to the second substrate 824 and the first substrate 804 eliminates warpage resulting in improved reliability.

It has been unexpectedly ascertained that the encapsulation 830 partially covering the vertical interconnects 810 provides robust structural integrity of the vertical interconnects 810.

It has been unexpectedly identified that the encapsulation 830 formed between the first substrate 804 and the second substrate 824 eliminates warpage.

Figure 9:
FIG. 9 is a cross-sectional view of the integrated circuit packaging system in a substrate-providing phase of manufacture.

Referring now to FIG. 9, therein is shown a cross-sectional view of the integrated circuit packaging system 800 in a substrate-providing phase of manufacture. The integrated circuit packaging system 800 can include the base package 802.

The first substrate 804 can be provided for the base package 802. For example, the first substrate 804 can represent a support structure including a multi-layer support structure. For a specific example, the first substrate 804 can represent a support structure including a printed circuit board (PCB), a laminated substrate, or a ceramic substrate. For another specific example, the first substrate 804 can represent a base substrate.

The base package 802 can include the vertical interconnects 810 mounted directly on the first substrate top side 808. The vertical interconnects 810 can be mounted adjacent a periphery of the first substrate 804.

For example, the vertical interconnects 810 can represent electrical connectors including a conductive pillar, a conductive post, or a conductive column. Also for example, the vertical interconnects 810 can be formed with an electrically conductive material including a metallic material or a metal alloy. Further for example, the vertical interconnects 810 and the first substrate 804 can be provided or supplied together. For a specific example, the vertical interconnects 810 can represent copper (Cu) pillars.

A vertical height of each of the vertical interconnects 810 can be controlled such that the second substrate bottom side 826 of FIG. 8 can be mounted directly on the vertical interconnects 810 and the integrated circuit inactive side 816 of FIG. 8 in a subsequent phase. The vertical height of each of the vertical interconnects 810 can be controlled with an application of a mask layer (not shown). The mask layer is defined as a structure resistant to a removal process. For example, the mask layer can represent a structure including a dry film resist (DFR) or a resist mask.

The mask layer can be deposited or applied directly on the first substrate top side 808. The mask layer can be patterned such that the mask layer can include a pattern of openings exposing portions of the first substrate top side 808. A plating process can be performed to fill an electrically conductive material within the openings forming the vertical interconnects 810 directly on the first substrate top side 808. The electrically conductive material can be filled up to a top surface of the mask layer. The mask layer can be removed leaving portions of the first substrate top side 808 exposed.

The vertical height of each of the vertical interconnects 810 can be approximately equal to a vertical thickness of the mask layer, which is defined as a vertical distance extending from a bottom surface of the mask layer to the top surface of the mask layer. For a specific example, the vertical height of each of the vertical interconnects 810 can be equal to the vertical thickness of the mask layer. For another specific example, planes of top extents of the vertical interconnects 810 and a plane of a top surface of the mask layer can be coplanar with each other.

Figure 10:
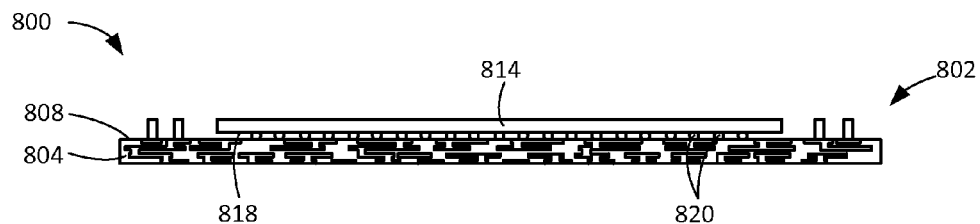
FIG. 10 is the structure of FIG. 9 in a first mounting phase.

Referring now to FIG. 10, therein is shown the structure of FIG. 9 in a first mounting phase. The base package 802 can include the integrated circuit 814 mounted over the first substrate 804. The integrated circuit active side 818 can be attached to the first substrate top side 808 with the connectors 820. For example, the integrated circuit 814 can represent a semiconductor device including a flip chip, an integrated circuit die, or a wirebond integrated circuit.

For example, the connectors 820 can represent electrical connectors including conductive bumps, conductive balls, or conductive studs. Also for example, the connectors 820 can be formed with an electrically conductive material including a metallic material or a metal alloy. For a specific example, the connectors 820 can represent electrical connectors including solder bumps.

Figure 11:
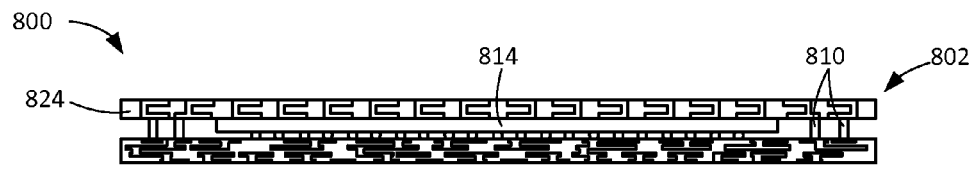
FIG. 11 is the structure of FIG. 10 in a second mounting phase.

Referring now to FIG. 11, therein is shown the structure of FIG. 10 in a second mounting phase. The base package 802 can include the second substrate 824 mounted over the vertical interconnects 810 and the integrated circuit 814. The second substrate 824 can be attached directly on the vertical interconnects 810 and the integrated circuit 814. For example, the second substrate 824 can represent a support structure including a multi-layer support structure. For a specific example, the second substrate 824 can represent a support structure including an interposer, a printed circuit board (PCB), a laminated substrate, or a ceramic substrate.

Figure 12:
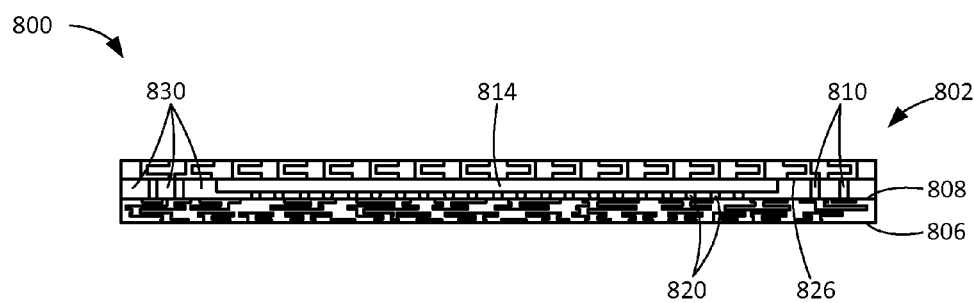
FIG. 12 is the structure of FIG. 11 in a molding phase.

Referring now to FIG. 12, therein is shown the structure of FIG. 11 in a molding phase. The base package 802 can include the encapsulation 830. The encapsulation 830 can partially cover the first substrate top side 808, the vertical interconnects 810, the integrated circuit 814, the connectors 820, and the second substrate bottom side 826. For example, the encapsulation 830 can represent a package cover including a molded underfill.

In a subsequent phase, the base interconnects 846 of FIG. 8 can be attached to the first substrate bottom side 806. The base interconnects 846 can represent electrical connectors including conductive balls, conductive columns, or conductive studs. The base interconnects 846 can be formed with a conductive material including a metallic material or a metal alloy. For example, the base interconnects 846 can represent electrical connectors including solder balls.

Figure 13:
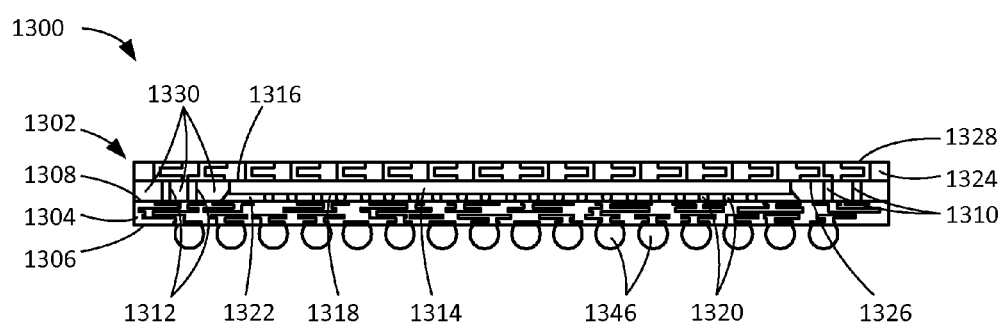
FIG. 13 is a cross-sectional view of an integrated circuit packaging system in a third embodiment of the present invention.

Referring now to FIG. 13, therein is shown a cross-sectional view of an integrated circuit packaging system 1300 in a third embodiment of the present invention. The integrated circuit packaging system 1300 can include an enhanced fan-in package-on-package base (FiPoPb) package using copper (Cu) pillar or a molded fan-in package-on-package base package using copper pillar to control warpage.

The integrated circuit packaging system 1300 can include a base package 1302, which is defined as a semiconductor package. The base package 1302 can include a first substrate 1304 having a first substrate bottom side 1306 and a first substrate top side 1308 opposite the first substrate bottom side 1306. The first substrate 1304 is defined as a support structure for mounting and connecting an integrated circuit thereto including providing electrical connections through the support structure.

The base package 1302 can include vertical interconnects 1310 having non-horizontal sides 1312. The vertical interconnects 1310 can be attach directly on the first substrate top side 1308. The vertical interconnects 1310 are defined as electrically conductive structures for mounting and connection purposes. The non-horizontal sides 1312 are defined as sides that form a lateral boundary of the vertical interconnects 1310.

For example, the non-horizontal sides 1312 can be perpendicularly attached to the first substrate top side 1308. Also for example, the non-horizontal sides 1312 can be parallel to each other.

As an example, the non-horizontal sides 1312 can include planar or curve surfaces. As another example, the vertical interconnects 1310 can include vertical heights approximately equal to each other. As a specific example, the vertical interconnects 1310 can include vertical heights equal to each other.

The base package 1302 can include an integrated circuit 1314 having an integrated circuit inactive side 1316 and an integrated circuit active side 1318 opposite the integrated circuit inactive side 1316. The integrated circuit 1314 is defined as a semiconductor device having a number of integrated transistors interconnected to form active circuits. The integrated circuit 1314 can be mounted over the first substrate 1304 with the integrated circuit active side 1318 facing the first substrate top side 1308.

The base package 1302 can include connectors 1320 attached to the integrated circuit active side 1318 and the first substrate top side 1308. The connectors 1320 are defined as electrically conductive connectors for connecting an integrated circuit to another system level.

The base package 1302 can include an underfill 1322 filled between the integrated circuit active side 1318 and the first substrate top side 1308. The underfill 1322 can be applied directly on the connectors 1320 to protect the connectors 1320.

Each of the vertical interconnects 1310 can include a vertical height approximately equal to a combination of a vertical height of the integrated circuit 1314 and a vertical height of each of the connectors 1320. For a specific example, each of the vertical interconnects 1310 can include a vertical height equal to a combination of a vertical height of the integrated circuit 1314 and a vertical height of each of the connectors 1320.

A vertical height of each of the vertical interconnects 1310 is defined as a vertical distance extending between bottom and top extents of each of the vertical interconnects 1310. A vertical height of the integrated circuit 1314 is defined as a vertical distance extending between the integrated circuit inactive side 1316 and the integrated circuit active side 1318.

A vertical height of each of the connectors 1320 is defined as a vertical distance extending between bottom and top extents of each of the connectors 1320. A vertical height of each of the connectors 1320 can represent a vertical distance extending between the integrated circuit active side 1318 and the first substrate top side 1308.

The base package 1302 can include a second substrate 1324 having a second substrate bottom side 1326 and a second substrate top side 1328 opposite the second substrate bottom side 1326. The second substrate 1324 can be mounted over the vertical interconnects 1310 and the integrated circuit 1314. The second substrate bottom side 1326 can be directly on the vertical interconnects 1310 and the integrated circuit inactive side 1316. The second substrate 1324 is defined as a support structure for mounting and connecting an integrated circuit thereto including providing electrical connections through the support structure.

The second substrate 1324 can include a horizontal length approximately equal to a horizontal length of the first substrate 1304. For a specific example, the second substrate 1324 can include a horizontal length equal to a horizontal length of the first substrate 1304. Horizontal lengths of the second substrate 1324 and the first substrate 1304 are defined as horizontal distances between non-horizontal sides of the second substrate 1324 and the first substrate 1304, respectively.

The vertical interconnects 1310 can be joined or attached to the first substrate 1304 and the second substrate 1324. For example, the vertical interconnects 1310 can be attached to the first substrate 1304, the second substrate 1324, or a combination thereof with solder on pad (SOP), solder cap on each of the vertical interconnects 1310, or conductive paste.

The base package 1302 can include an encapsulation 1330, which is defined as a package cover of a semiconductor package to seal an integrated circuit providing mechanical and environmental protection. The encapsulation 1330 can be formed between the first substrate 1304 and the second substrate 1324. The encapsulation 1330 can partially cover the first substrate top side 1308, the vertical interconnects 1310, the integrated circuit 1314, the underfill 1322, and the second substrate bottom side 1326.

The base package 1302 can include base interconnects 1346 attached to the first substrate bottom side 1306 to provide electrical connection between the first substrate 1304 and an external system (not shown). The base interconnects 1346 are defined as electrically conductive connectors.

It has been discovered that the second substrate 1324 directly on the vertical interconnects 1310 and the integrated circuit inactive side 1316 provides a significant reduction of package thickness and size thereby solving problems of large fan-in package-on-package base (FiPoPb) package, total thickness of stacked packages, and manufacturing cost.

It has also been discovered that each of the vertical interconnects 1310 having a vertical height approximately equal to a combination of a vertical height of the integrated circuit 1314 and a vertical height of each of the connectors 1320 provides reduced package height profile.

It has been unexpectedly found that each of the vertical interconnects 1310 formed with a single integral structure provides structural integrity.

It has been unexpectedly determined that the vertical interconnects 1310 provide pitch and size reduction compared to other package-on-package packages, which are limited in reducing package size and thickness because of large interconnection pitch or size such as using solder balls for interconnection with wider substrate area due to large solder ball diameter and equipment capacity of solder ball mounter.

It has been unexpectedly recognized that the vertical interconnects 1310 attached to the second substrate 1324 and the first substrate 1304 eliminates warpage resulting in improved reliability.

It has been unexpectedly ascertained that the encapsulation 1330 partially covering the vertical interconnects 1310 provides robust structural integrity of the vertical interconnects 1310.

It has been unexpectedly identified that the encapsulation 1330 formed between the first substrate 1304 and the second substrate 1324 eliminates warpage.

Figure 14:
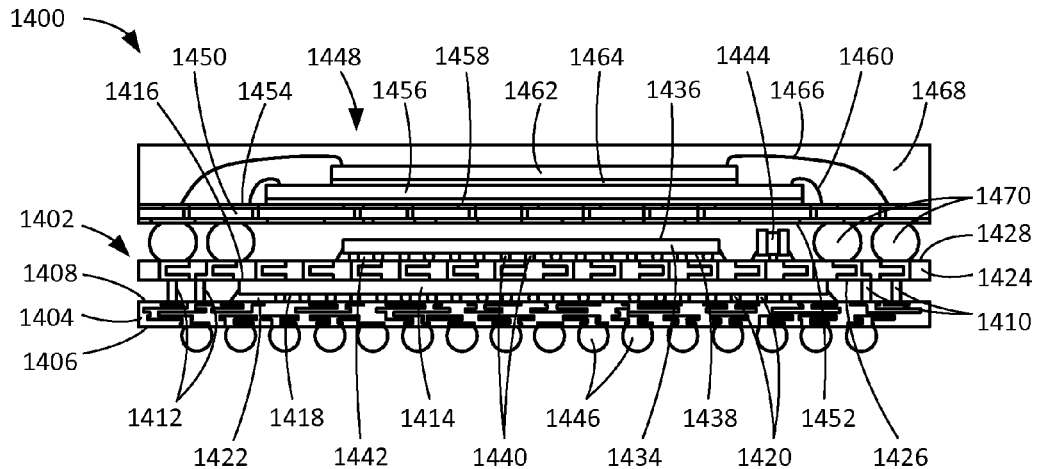
FIG. 14 is a cross-sectional view of an integrated circuit packaging system in a fourth embodiment of the present invention.

Referring now to FIG. 14, therein is shown a cross-sectional view of an integrated circuit packaging system 1400 in a fourth embodiment of the present invention. The integrated circuit packaging system 1400 can include an enhanced fan-in package-on-package base (FiPoPb) package using copper (Cu) pillar or an NG fan-in package-on-package base package without mold. The integrated circuit packaging system 1400 can also represent a thin three-tier fan-in package-on-package packaging system with memory, modem, and logic.

The integrated circuit packaging system 1400 can include a base package 1402, which is defined as a semiconductor package. The base package 1402 can include a first substrate 1404 having a first substrate bottom side 1406 and a first substrate top side 1408 opposite the first substrate bottom side 1406. The first substrate 1404 is defined as a support structure for mounting and connecting an integrated circuit thereto including providing electrical connections through the support structure.

The base package 1402 can include vertical interconnects 1410 having non-horizontal sides 1412. The vertical interconnects 1410 can be attach directly on the first substrate top side 1408. The vertical interconnects 1410 are defined as electrically conductive structures for mounting and connection purposes. The non-horizontal sides 1412 are defined as sides that form a lateral boundary of the vertical interconnects 1410.

For example, the non-horizontal sides 1412 can be perpendicularly attached to the first substrate top side 1408. Also for example, the non-horizontal sides 1412 can be parallel to each other.

As an example, the non-horizontal sides 1412 can include planar or curve surfaces. As another example, the vertical interconnects 1410 can include vertical heights approximately equal to each other. As a specific example, the vertical interconnects 1410 can include vertical heights equal to each other.

The base package 1402 can include a first integrated circuit 1414 having a first integrated circuit inactive side 1416 and a first integrated circuit active side 1418 opposite the first integrated circuit inactive side 1416. The first integrated circuit 1414 is defined as a semiconductor device having a number of integrated transistors interconnected to form active circuits. The first integrated circuit 1414 can be mounted over the first substrate 1404 with the first integrated circuit active side 1418 facing the first substrate top side 1408.

The base package 1402 can include first connectors 1420 attached to the first integrated circuit active side 1418 and the first substrate top side 1408. The first connectors 1420 are defined as electrically conductive connectors for connecting an integrated circuit to another system level.

The base package 1402 can include a first underfill 1422 filled between the first integrated circuit active side 1418 and the first substrate top side 1408. The first underfill 1422 can be applied directly on the first connectors 1420 to protect the first connectors 1420.

Each of the vertical interconnects 1410 can include a vertical height approximately equal to a combination of a vertical height of the first integrated circuit 1414 and a vertical height of each of the first connectors 1420. For a specific example, each of the vertical interconnects 1410 can include a vertical height equal to a combination of a vertical height of the first integrated circuit 1414 and a vertical height of each of the first connectors 1420.

A vertical height of each of the vertical interconnects 1410 is defined as a vertical distance extending between bottom and top extents of each of the vertical interconnects 1410. A vertical height of the first integrated circuit 1414 is defined as a vertical distance extending between the first integrated circuit inactive side 1416 and the first integrated circuit active side 1418.

A vertical height of each of the first connectors 1420 is defined as a vertical distance extending between bottom and top extents of each of the first connectors 1420. A vertical height of each of the first connectors 1420 can represent a vertical distance extending between the first integrated circuit active side 1418 and the first substrate top side 1408.

The base package 1402 can include a second substrate 1424 having a second substrate bottom side 1426 and a second substrate top side 1428 opposite the second substrate bottom side 1426. The second substrate 1424 can be mounted over the vertical interconnects 1410 and the first integrated circuit 1414. The second substrate bottom side 1426 can be directly on the vertical interconnects 1410 and the first integrated circuit inactive side 1416. The second substrate 1424 is defined as a support structure for mounting and connecting an integrated circuit thereto including providing electrical connections through the support structure.

The second substrate 1424 can include a horizontal length approximately equal to a horizontal length of the first substrate 1404. For a specific example, the second substrate 1424 can include a horizontal length equal to a horizontal length of the first substrate 1404. Horizontal lengths of the second substrate 1424 and the first substrate 1404 are defined as horizontal distances between non-horizontal sides of the second substrate 1424 and the first substrate 1404, respectively.

The vertical interconnects 1410 can be joined or attached to the first substrate 1404 and the second substrate 1424. For example, the vertical interconnects 1410 can be attached to the first substrate 1404, the second substrate 1424, or a combination thereof with solder on pad (SOP), solder cap on each of the vertical interconnects 1410, or conductive paste.

The base package 1402 can include a second integrated circuit 1434 having a second integrated circuit inactive side 1436 and a second integrated circuit active side 1438 opposite the second integrated circuit inactive side 1436. The second integrated circuit 1434 is defined as a semiconductor device having a number of integrated transistors interconnected to form active circuits. The second integrated circuit 1434 can be mounted over the second substrate 1424 with the second integrated circuit active side 1438 facing the second substrate top side 1428.

The base package 1402 can include second connectors 1440 attached to the second integrated circuit active side 1438 and the second substrate top side 1428. The second connectors 1440 are defined as electrically conductive connectors for connecting an integrated circuit to another system level.

The base package 1402 can include a second underfill 1442 filled between the second integrated circuit active side 1438 and the second substrate top side 1428. The second underfill 1442 can be applied directly on the second connectors 1440 to protect the second connectors 1440.

The base package 1402 can include a component 1444 mounted over the second substrate top side 1428. The component 1444 is defined as a semiconductor device. The component 1444 can be adjacent the second integrated circuit 1434. For example, the component 1444 can represent a semiconductor device including a passive component. For a specific example, the component 1444 can represent a capacitor or a resistor.

The base package 1402 can include base interconnects 1446 attached to the first substrate bottom side 1406 to provide electrical connection between the first substrate 1404 and an external system (not shown). The base interconnects 1446 are defined as electrically conductive connectors.

The integrated circuit packaging system 1400 can include a stack package 1448, which is defined as a semiconductor package, mounted over the base package 1402. The stack package 1448 can include a stack substrate 1450 having a stack substrate bottom side 1452 and a stack substrate top side 1454 opposite the stack substrate bottom side 1452.

The stack substrate 1450 is defined as a support structure for mounting and connecting an integrated circuit thereto including providing electrical connections through the support structure. For example, the stack substrate 1450 can represent a support structure including a multi-layer support structure including a printed circuit board (PCB), a laminated substrate, or a ceramic substrate.

The stack package 1448 can include a horizontal length approximately equal to a horizontal length of the base package 1402. As a specific example, the stack package 1448 can include a horizontal length equal to a horizontal length of the base package 1402.

The stack package 1448 can include a first device 1456 attached to the stack substrate 1450 with a first attach layer 1458. The first device 1456 can be electrically connected to the stack substrate top side 1454 with first device connectors 1460.

The stack package 1448 can include a second device 1462 attached to the first device 1456 with a second attach layer 1464. The second device 1462 can be electrically connected to the stack substrate top side 1454 with second device connectors 1466.

The stack package 1448 can include a stack encapsulation 1468 over the stack substrate 1450, the first device 1456, the first attach layer 1458, the first device connectors 1460, the second device 1462, the second attach layer 1464, and the second device connectors 1466. The stack package 1448 can include stack connectors 1470 attached to the stack substrate bottom side 1452 and the second substrate top side 1428 to provide electrical connection between the stack substrate 1450 and the second substrate 1424.

The stack connectors 1470 are defined as electrically conductive connectors. The stack connectors 1470 can represent electrical connectors including conductive balls, conductive columns, or conductive studs. The stack connectors 1470 can be formed with a conductive material including a metallic material or a metal alloy. For example, the stack connectors 1470 can represent electrical connectors including solder balls.

The second integrated circuit 1434 and the component 1444 can be surrounded by a peripheral array of the stack connectors 1470. The peripheral array is defined as multiple rows of the stack connectors 1470 formed adjacent a perimeter of the stack substrate 1450.

It has been discovered that the second substrate 1424 directly on the vertical interconnects 1410 and the first integrated circuit inactive side 1416 provides a significant reduction of package thickness and size thereby solving problems of large fan-in package-on-package base (FiPoPb) package, total thickness of stacked packages, and manufacturing cost.

It has also been discovered that each of the vertical interconnects 1410 having a vertical height approximately equal to a combination of a vertical height of the first integrated circuit 1414 and a vertical height of each of the first connectors 1420 provides reduced package height profile.

It has been unexpectedly found that each of the vertical interconnects 1410 formed with a single integral structure provides structural integrity.

It has been unexpectedly determined that the vertical interconnects 1410 provide pitch and size reduction compared to other package-on-package packages, which are limited in reducing package size and thickness because of large interconnection pitch or size such as using solder balls for interconnection with wider substrate area due to large solder ball diameter and equipment capacity of solder ball mounter.

It has been unexpectedly recognized that the vertical interconnects 1410 attached to the second substrate 1424 and the first substrate 1404 eliminates warpage resulting in improved reliability.

Figure 15:
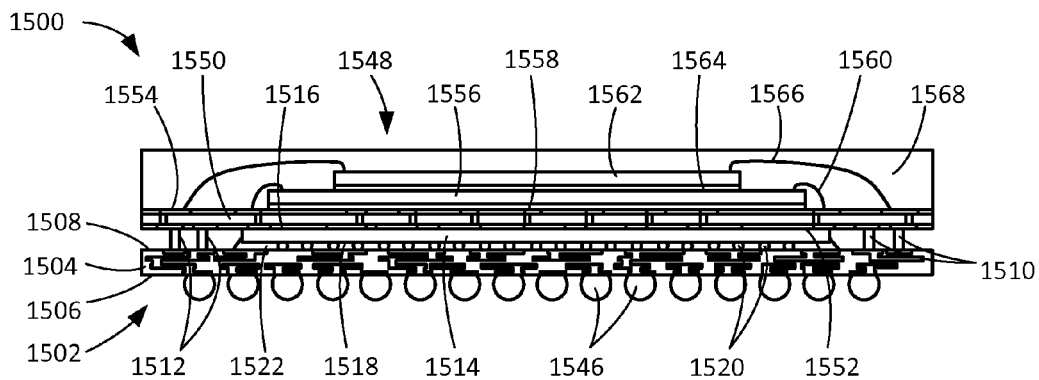
FIG. 15 is a cross-sectional view of an integrated circuit packaging system in a fifth embodiment of the present invention.

Referring now to FIG. 15, therein is shown a cross-sectional view of an integrated circuit packaging system 1500 in a fifth embodiment of the present invention. The integrated circuit packaging system 1500 can include an enhanced fan-in package-on-package base (FiPoPb) package using copper (Cu) pillar or an NG fan-in package-on-package base package without mold. The integrated circuit packaging system 1500 can also represent a packaging system with direct package interconnection.

The integrated circuit packaging system 1500 can include a base package 1502, which is defined as a semiconductor package. The base package 1502 can include a first substrate 1504 having a first substrate bottom side 1506 and a first substrate top side 1508 opposite the first substrate bottom side 1506. The first substrate 1504 is defined as a support structure for mounting and connecting an integrated circuit thereto including providing electrical connections through the support structure.

The base package 1502 can include vertical interconnects 1510 having non-horizontal sides 1512. The vertical interconnects 1510 can be attach directly on the first substrate top side 1508. The vertical interconnects 1510 are defined as electrically conductive structures for mounting and connection purposes. The non-horizontal sides 1512 are defined as sides that form a lateral boundary of the vertical interconnects 1510.

For example, the non-horizontal sides 1512 can be perpendicularly attached to the first substrate top side 1508. Also for example, the non-horizontal sides 1512 can be parallel to each other.

As an example, the non-horizontal sides 1512 can include planar or curve surfaces. As another example, the vertical interconnects 1510 can include vertical heights approximately equal to each other. As a specific example, the vertical interconnects 1510 can include vertical heights equal to each other.

The base package 1502 can include a first integrated circuit 1514 having a first integrated circuit inactive side 1516 and a first integrated circuit active side 1518 opposite the first integrated circuit inactive side 1516. The first integrated circuit 1514 is defined as a semiconductor device having a number of integrated transistors interconnected to form active circuits. The first integrated circuit 1514 can be mounted over the first substrate 1504 with the first integrated circuit active side 1518 facing the first substrate top side 1508.

The base package 1502 can include first connectors 1520 attached to the first integrated circuit active side 1518 and the first substrate top side 1508. The first connectors 1520 are defined as electrically conductive connectors for connecting an integrated circuit to another system level.

The base package 1502 can include a first underfill 1522 filled between the first integrated circuit active side 1518 and the first substrate top side 1508. The first underfill 1522 can be applied directly on the first connectors 1520 to protect the first connectors 1520.

Each of the vertical interconnects 1510 can include a vertical height approximately equal to a combination of a vertical height of the first integrated circuit 1514 and a vertical height of each of the first connectors 1520. As a specific example, each of the vertical interconnects 1510 can include a vertical height equal to a combination of a vertical height of the first integrated circuit 1514 and a vertical height of each of the first connectors 1520.

A vertical height of each of the vertical interconnects 1510 is defined as a vertical distance extending between bottom and top extents of each of the vertical interconnects 1510. A vertical height of the first integrated circuit 1514 is defined as a vertical distance extending between the first integrated circuit inactive side 1516 and the first integrated circuit active side 1518.

A vertical height of each of the first connectors 1520 is defined as a vertical distance extending between bottom and top extents of each of the first connectors 1520. A vertical height of each of the first connectors 1520 can represent a vertical distance extending between the first integrated circuit active side 1518 and the first substrate top side 1508.

The base package 1502 can include base interconnects 1546 attached to the first substrate bottom side 1506 to provide electrical connection between the first substrate 1504 and an external system (not shown). The base interconnects 1546 are defined as electrically conductive connectors.

The integrated circuit packaging system 1500 can include a stack package 1548, which is defined as a semiconductor package, mounted over the base package 1502. The stack package 1548 can include a second substrate 1550 having a second substrate bottom side 1552 and a second substrate top side 1554 opposite the second substrate bottom side 1552.

The second substrate 1550 is defined as a support structure for mounting and connecting an integrated circuit thereto including providing electrical connections through the support structure. For example, the second substrate 1550 can represent a support structure including a multi-layer support structure including a printed circuit board (PCB), a laminated substrate, or a ceramic substrate.

The second substrate 1550 can be mounted over the vertical interconnects 1510 and the first integrated circuit 1514. The second substrate bottom side 1552 can be directly on the vertical interconnects 1510 and the first integrated circuit inactive side 1516. The second substrate 1550 can be electrically connected to the first substrate 1504 with the vertical interconnects 1510.

The second substrate 1550 can include a horizontal length approximately equal to a horizontal length of the first substrate 1504. For a specific example, the second substrate 1550 can include a horizontal length equal to a horizontal length of the first substrate 1504. Horizontal lengths of the second substrate 1550 and the first substrate 1504 are defined as horizontal distances between non-horizontal sides of the second substrate 1550 and the first substrate 1504, respectively.

The vertical interconnects 1510 can be joined or attached to the first substrate 1504 and the second substrate 1550. For example, the vertical interconnects 1510 can be attached to the first substrate 1504, the second substrate 1550, or a combination thereof with solder on pad (SOP), solder cap on each of the vertical interconnects 1510, or conductive paste.

The stack package 1548 can include a horizontal length approximately equal to a horizontal length of the base package 1502. As a specific example, the stack package 1548 can include a horizontal length equal to a horizontal length of the base package 1502.

The stack package 1548 can include a first device 1556 attached to the second substrate 1550 with a first attach layer 1558. The first device 1556 can be electrically connected to the second substrate top side 1554 with first device connectors 1560.

The stack package 1548 can include a second device 1562 attached to the first device 1556 with a second attach layer 1564. The second device 1562 can be electrically connected to the second substrate top side 1554 with second device connectors 1566. The stack package 1548 can include a stack encapsulation 1568 over the second substrate 1550, the first device 1556, the first attach layer 1558, the first device connectors 1560, the second device 1562, the second attach layer 1564, and the second device connectors 1566.

It has been discovered that the second substrate 1550 directly on the vertical interconnects 1510 and the first integrated circuit inactive side 1516 provides a significant reduction of package thickness and size thereby solving problems of large fan-in package-on-package base (FiPoPb) package, total thickness of stacked packages, and manufacturing cost.

It has also been discovered that each of the vertical interconnects 1510 having a vertical height approximately equal to a combination of a vertical height of the first integrated circuit 1514 and a vertical height of each of the first connectors 1520 provides reduced package height profile.

It has been unexpectedly found that each of the vertical interconnects 1510 formed with a single integral structure provides structural integrity.

It has been unexpectedly determined that the vertical interconnects 1510 provide pitch and size reduction compared to other package-on-package packages, which are limited in reducing package size and thickness because of large interconnection pitch or size such as using solder balls for interconnection with wider substrate area due to large solder ball diameter and equipment capacity of solder ball mounter.

It has been unexpectedly recognized that the vertical interconnects 1510 attached to the second substrate 1550 and the first substrate 1504 eliminates warpage resulting in improved reliability.

Figure 16:
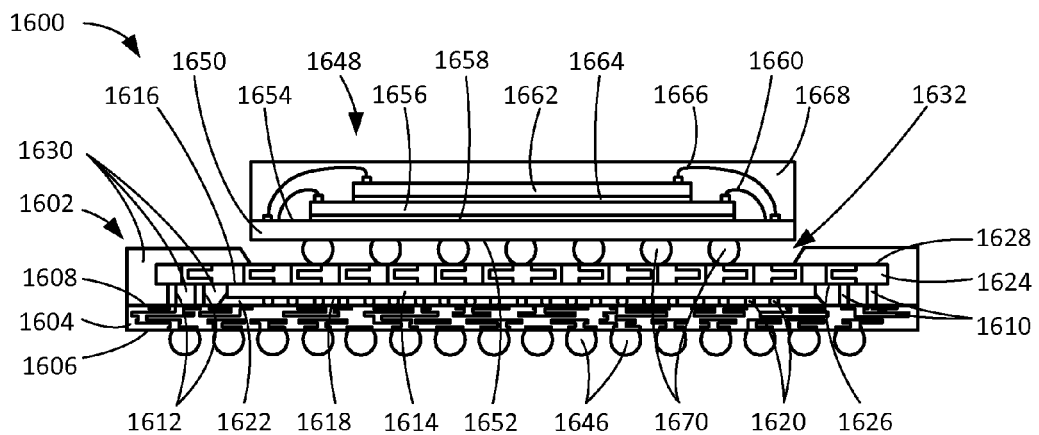
FIG. 16 is a cross-sectional view of an integrated circuit packaging system in a sixth embodiment of the present invention.

Referring now to FIG. 16, therein is shown a cross-sectional view of an integrated circuit packaging system 1600 in a sixth embodiment of the present invention. The integrated circuit packaging system 1600 can include an enhanced fan-in package-on-package base (FiPoPb) package using copper (Cu) pillar.

The integrated circuit packaging system 1600 can include a base package 1602, which is defined as a semiconductor package. The base package 1602 can include a first substrate 1604 having a first substrate bottom side 1606 and a first substrate top side 1608 opposite the first substrate bottom side 1606. The first substrate 1604 is defined as a support structure for mounting and connecting an integrated circuit thereto including providing electrical connections through the support structure.

The base package 1602 can include vertical interconnects 1610 having non-horizontal sides 1612. The vertical interconnects 1610 can be attach directly on the first substrate top side 1608. The vertical interconnects 1610 are defined as electrically conductive structures for mounting and connection purposes. The non-horizontal sides 1612 are defined as sides that form a lateral boundary of the vertical interconnects 1610.

For example, the non-horizontal sides 1612 can be perpendicularly attached to the first substrate top side 1608. Also for example, the non-horizontal sides 1612 can be parallel to each other.

As an example, the non-horizontal sides 1612 can include planar or curve surfaces. As another example, the vertical interconnects 1610 can include vertical heights approximately equal to each other. As a specific example, the vertical interconnects 1610 can include vertical heights equal to each other.

The base package 1602 can include an integrated circuit 1614 having an integrated circuit inactive side 1616 and an integrated circuit active side 1618 opposite the integrated circuit inactive side 1616. The integrated circuit 1614 is defined as a semiconductor device having a number of integrated transistors interconnected to form active circuits. The integrated circuit 1614 can be mounted over the first substrate 1604 with the integrated circuit active side 1618 facing the first substrate top side 1608.

The base package 1602 can include connectors 1620 attached to the integrated circuit active side 1618 and the first substrate top side 1608. The connectors 1620 are defined as electrically conductive connectors for connecting an integrated circuit to another system level.

The base package 1602 can include an underfill 1622 filled between the integrated circuit active side 1618 and the first substrate top side 1608. The underfill 1622 can be applied directly on the connectors 1620 to protect the connectors 1620.

Each of the vertical interconnects 1610 can include a vertical height approximately equal to a combination of a vertical height of the integrated circuit 1614 and a vertical height of each of the connectors 1620. For a specific example, each of the vertical interconnects 1610 can include a vertical height equal to a combination of a vertical height of the integrated circuit 1614 and a vertical height of each of the connectors 1620.

A vertical height of each of the vertical interconnects 1610 is defined as a vertical distance extending between bottom and top extents of each of the vertical interconnects 1610. A vertical height of the integrated circuit 1614 is defined as a vertical distance extending between the integrated circuit inactive side 1616 and the integrated circuit active side 1618.

A vertical height of each of the connectors 1620 is defined as a vertical distance extending between bottom and top extents of each of the connectors 1620. A vertical height of each of the connectors 1620 can represent a vertical distance extending between the integrated circuit active side 1618 and the first substrate top side 1608.

The base package 1602 can include a second substrate 1624 having a second substrate bottom side 1626 and a second substrate top side 1628 opposite the second substrate bottom side 1626. The second substrate 1624 can be mounted over the vertical interconnects 1610 and the integrated circuit 1614. The second substrate bottom side 1626 can be directly on the vertical interconnects 1610 and the integrated circuit inactive side 1616. The second substrate 1624 is defined as a support structure for mounting and connecting an integrated circuit thereto including providing electrical connections through the support structure.

The second substrate 1624 can be smaller than the first substrate 1604 with the second substrate 1624 having a horizontal length less than a horizontal length of the first substrate 1604. The second substrate 1624 can include a horizontal length greater than half of a horizontal length of the first substrate 1604. Horizontal lengths of the second substrate 1624 and the first substrate 1604 are defined as horizontal distances between non-horizontal sides of the second substrate 1624 and the first substrate 1604, respectively.

The vertical interconnects 1610 can be joined or attached to the first substrate 1604 and the second substrate 1624. For example, the vertical interconnects 1610 can be attached to the first substrate 1604, the second substrate 1624, or a combination thereof with solder on pad (SOP), solder cap on each of the vertical interconnects 1610, or conductive paste.

The base package 1602 can include an encapsulation 1630, which is defined as a package cover of a semiconductor package to seal an integrated circuit providing mechanical and environmental protection. The encapsulation 1630 can be formed over the first substrate 1604 and the second substrate 1624.

The encapsulation 1630 can partially cover the first substrate top side 1608, the vertical interconnects 1610, the integrated circuit 1614, the underfill 1622, and the second substrate bottom side 1626. For example, the encapsulation 1630 can represent a package cover including a molded underfill.

The encapsulation 1630 can include an encapsulation cavity 1632 at a top central portion of the encapsulation 1630. A portion of the second substrate top side 1628 can be exposed from the encapsulation cavity 1632.

The base package 1602 can include base interconnects 1646 attached to the first substrate bottom side 1606 to provide electrical connection between the first substrate 1604 and an external system (not shown). The base interconnects 1646 are defined as electrically conductive connectors.

The integrated circuit packaging system 1600 can include a stack package 1648, which is defined as a semiconductor package, mounted over the base package 1602. The stack package 1648 can include a stack substrate 1650 having a stack substrate bottom side 1652 and a stack substrate top side 1654 opposite the stack substrate bottom side 1652.

The stack substrate 1650 is defined as a support structure for mounting and connecting an integrated circuit thereto including providing electrical connections through the support structure. For example, the stack substrate 1650 can represent a support structure including a multi-layer support structure including a printed circuit board (PCB), a laminated substrate, or a ceramic substrate.

The stack package 1648 can include a horizontal length greater than half of a horizontal length of the base package 1602. The stack package 1648 can include a horizontal length less than a horizontal length of the base package 1602.

The stack package 1648 can include a first device 1656 attached to the stack substrate 1650 with a first attach layer 1658. The first device 1656 can be electrically connected to the stack substrate top side 1654 with first device connectors 1660.

The stack package 1648 can include a second device 1662 attached to the first device 1656 with a second attach layer 1664. The second device 1662 can be electrically connected to the stack substrate top side 1654 with second device connectors 1666.

The stack package 1648 can include a stack encapsulation 1668 over the stack substrate 1650, the first device 1656, the first attach layer 1658, the first device connectors 1660, the second device 1662, the second attach layer 1664, and the second device connectors 1666. The stack package 1648 can include stack connectors 1670 attached to the stack substrate bottom side 1652 and the second substrate top side 1628 to provide electrical connection between the stack substrate 1650 and the second substrate 1624.

The stack connectors 1670 are defined as electrically conductive connectors. The stack connectors 1670 can be attached to the second substrate top side 1628 within the encapsulation cavity 1632.

The stack connectors 1670 can represent electrical connectors including conductive balls, conductive columns, or conductive studs. The stack connectors 1670 can be formed with a conductive material including a metallic material or a metal alloy. For example, the stack connectors 1670 can represent electrical connectors including solder balls.

It has been discovered that the second substrate 1624 directly on the vertical interconnects 1610 and the integrated circuit inactive side 1616 provides a significant reduction of package thickness and size thereby solving problems of large fan-in package-on-package base (FiPoPb) package, total thickness of stacked packages, and manufacturing cost.

It has also been discovered that each of the vertical interconnects 1610 having a vertical height approximately equal to a combination of a vertical height of the integrated circuit 1614 and a vertical height of each of the connectors 1620 provides reduced package height profile.

It has been unexpectedly found that each of the vertical interconnects 1610 formed with a single integral structure provides structural integrity.

It has been unexpectedly determined that the vertical interconnects 1610 provide pitch and size reduction compared to other package-on-package packages, which are limited in reducing package pitch or size such as using solder balls for interconnection with wider substrate area due to large solder ball diameter and equipment capacity of solder ball mounter.

It has been unexpectedly recognized that the vertical interconnects 1610 attached to the second substrate 1624 and the first substrate 1604 eliminates warpage resulting in improved reliability.

Figure 17:
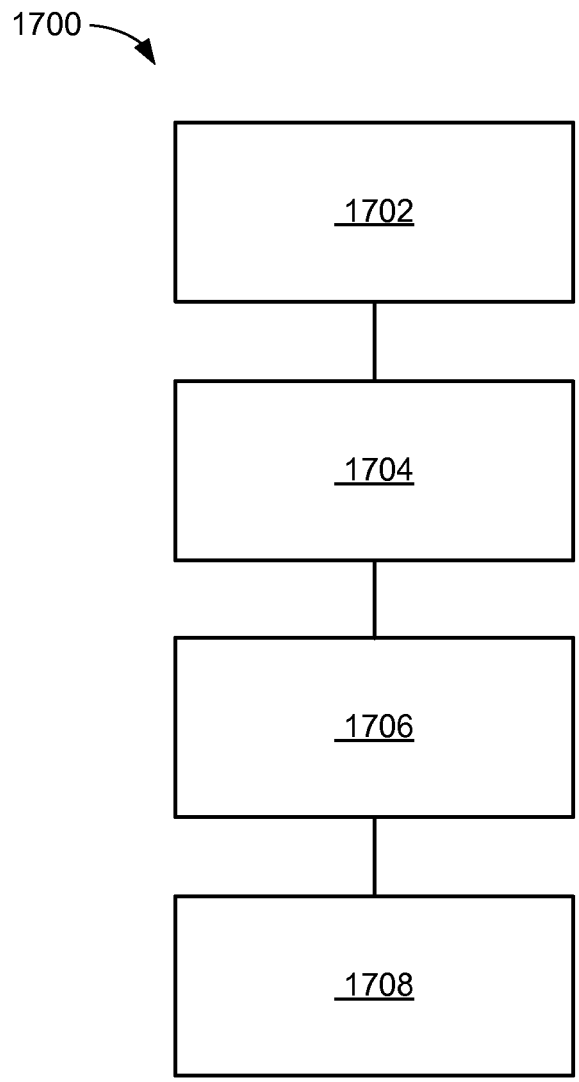
FIG. 17 is a flow chart of a method of manufacture of an integrated circuit packaging system in a further embodiment of the present invention.

Referring now to FIG. 17, therein is shown a flow chart of a method 1700 of manufacture of an integrated circuit packaging system in a further embodiment of the present invention. The method 1700 includes: providing a first substrate in a block 1702; attaching vertical interconnects along a periphery of the first substrate in a block 1704; mounting an integrated circuit over the first substrate, the integrated circuit surrounded by the vertical interconnects in a block 1706; and mounting a second substrate directly on the vertical interconnects and the integrated circuit in a block 1708.

Thus, it has been discovered that the integrated circuit packaging system of the present invention furnishes important and heretofore unknown and unavailable solutions, capabilities, and functional aspects for an integrated circuit packaging system with interconnects. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a first substrate;
   attaching vertical interconnects along a periphery of the first substrate;
   mounting an integrated circuit over the first substrate, the integrated circuit surrounded by the vertical interconnects; and
   mounting a second substrate directly on the vertical interconnects and an integrated circuit inactive side of the integrated circuit.

2. The method as claimed in claim 1 wherein mounting the integrated circuit includes mounting the integrated circuit over the first substrate, the integrated circuit surrounded by a peripheral array of the vertical interconnects.

3. The method as claimed in claim 1 further comprising mounting a second integrated circuit over the second substrate.

4. The method as claimed in claim 1 wherein mounting the second substrate includes mounting the second substrate directly on the vertical interconnects and the integrated circuit inactive side, the second substrate further including a stack package.

5. The method as claimed in claim 1 wherein mounting the second substrate includes mounting the second substrate directly on the vertical interconnects and the integrated circuit inactive side, the second substrate having a horizontal length less than a horizontal length of the first substrate.

6. The method as claimed in claim 1 wherein mounting the integrated circuit includes mounting the integrated circuit over the first substrate, the integrated circuit having an integrated circuit inactive side coplanar with a top extent of each of the vertical interconnects.

7. The method as claimed in claim 1 wherein attaching the vertical interconnects includes attaching the vertical interconnects perpendicular to the first substrate.

8. The method as claimed in claim 1 wherein attaching the vertical interconnects includes attaching the vertical interconnects directly on the first substrate, the vertical interconnects having vertical heights approximately equal to each other.

9. The method as claimed in claim 1 further comprising forming an encapsulation partially covering the vertical interconnects.

10. An integrated circuit packaging system comprising:
a first substrate;
vertical interconnects along a periphery of the first substrate;
an integrated circuit over the first substrate, the integrated circuit surrounded by the vertical interconnects; and
a second substrate directly on the vertical interconnects and the integrated circuit, wherein the second substrate is directly on an integrated circuit inactive side of the integrated circuit.

11. The system as claimed in claim 10 wherein the integrated circuit is surrounded by a peripheral array of the vertical interconnects.

12. The system as claimed in claim 10 further comprising a second integrated circuit over the second substrate.

13. The system as claimed in claim 10 wherein the second substrate further includes a stack package.

14. The system as claimed in claim 10 wherein the second substrate includes a horizontal length less than a horizontal length of the first substrate.

15. The system as claimed in claim 10 wherein the integrated circuit inactive side is coplanar with a top extent of each of the vertical interconnects.

16. The system as claimed in claim 10 wherein the vertical interconnects are perpendicular to the first substrate.

17. The system as claimed in claim 10 wherein the vertical interconnects include vertical heights approximately equal to each other.

18. The system as claimed in claim 10 further comprising an encapsulation partially covering the vertical interconnects.

* * * * *